(12) United States Patent
Friese et al.

(10) Patent No.: US 6,954,120 B2
(45) Date of Patent: Oct. 11, 2005

(54) TRAP CIRCUIT ARRANGEMENT

(75) Inventors: Norbert Friese, Taufkirchen (DE); Josef Mayr, Schwindegg (DE)

(73) Assignee: MD Elektronik GmbH, Waldkraiburg (DE)

( * ) Notice: Subject to any disclaimer, the term of this patent is extended or adjusted under 35 U.S.C. 154(b) by 0 days.

(21) Appl. No.: 10/745,789

(22) Filed: Dec. 22, 2003

(65) Prior Publication Data

US 2005/0104688 A1 May 19, 2005

(30) Foreign Application Priority Data

Nov. 13, 2003 (DE) .................................... 203 17 509 U

(51) Int. Cl.$^7$ .............................. H03H 7/01; H01F 27/06
(52) U.S. Cl. ......................................... 333/185; 333/12
(58) Field of Search ....................... 333/12, 181, 815, 333/176; 336/92; 343/703, 713

(56) References Cited

U.S. PATENT DOCUMENTS

| 5,959,587 A | * | 9/1999 | McHenry et al. ........... 343/713 |
| 6,072,125 A | * | 6/2000 | Takeuchi .................... 333/12 |
| 6,144,277 A | * | 11/2000 | Matsui et al. ................ 336/92 |
| 6,268,787 B1 | * | 7/2001 | Onizuka ..................... 336/92 |

FOREIGN PATENT DOCUMENTS

| JP | 10-189350 | 7/1998 |
| JP | 2001-167937 | 6/2001 |

* cited by examiner

Primary Examiner—Seungsook Ham
(74) Attorney, Agent, or Firm—Kenyon & Kenyon

(57) ABSTRACT

A trap circuit arrangement, e.g., for an antenna line in a motor vehicle, includes a first and a second cable and a choke coil. In this context, the choke coil has a first and a second connection region, the first cable being in electrical contact with the first connection region and the second cable being in electrical contact with the second connection region. The trap circuit arrangement also includes a housing, which accommodates the choke coil, is made up of two assembled parts, and has at least one clip element on its exterior for attachment to an attachment surface.

12 Claims, 4 Drawing Sheets

TRAP CIRCUIT ARRANGEMENT

CROSS-REFERENCE TO RELATED APPLICATIONS

The present application claims priority to Application No. 203 17 509.3, filed in the Federal Republic of Germany on Nov. 13, 2003, which is expressly incorporated herein in its entirety by reference thereto.

FIELD OF THE INVENTION

The present invention relates to a trap circuit arrangement, which has a choke coil in a housing and may be particularly suitable for installation in motor vehicles.

BACKGROUND INFORMATION

In modern motor vehicles, it is not rare for wires that heat rear windows to be simultaneously used as an antenna for receiving high-frequency signals. In order that, for example, starting pulses of the rear-window heater do not interfere with the received signals, choke coils having a corresponding inductance are often built into the supply line. To prevent damage, such choke coils must be protected, as a rule, from external influences, i.e., must be provided with electrical insulation.

In conventional arrangements, choke coils are, for example, surrounded by a shrink tube or encapsulated by a synthetic-resin compound to protect them from the environment. In addition, designs in which the choke coil is accommodated in a housing are conventional.

Japanese Published Patent Application No. 2001-167937 describes a trap circuit arrangement, in which a choke coil is situated inside a housing. In this context, a connection region of the choke coil is in electrical contact with a cable end, while the other connection end of the choke coil is contacted by a component, which is soldered to a current distribution busbar.

Japanese Published Patent Application No. 10-189350 describes a trap circuit arrangement, where a choke coil is accommodated in a housing that is closable by a cover. In this case, conductor tabs protruding from the housing are soldered to an attachment surface, small cylindrical nubs being provided for simpler placement on the soldering surfaces.

Conventional designs of trap circuit arrangements having a choke coil, in particular those used in motor vehicles, have, inter alia, the disadvantage that they are comparatively expensive to manufacture or assemble.

It is an aspect of the present invention to provide a trap circuit arrangement, which has a housing of the type mentioned at the outset, which may eliminate the above-mentioned disadvantages, and which may allow inexpensive assembly.

SUMMARY

The above and other beneficial aspects of the present invention may be achieved by providing a trap circuit arrangement as described herein.

According to this, a trap circuit arrangement according to an example embodiment of the present invention includes a housing, which accommodates a choke coil and is made up of a plurality of assembled parts, e.g., two half-shells. In addition, the housing has at least one clip element on its exterior for attachment to an attachment surface.

In an example embodiment of the present invention, the parts of the housing may already be interconnected prior to assembly, for instance by a flexurally soft strip, so that the assembly is accomplished by a swiveling motion or folding motion.

Alternatively, the parts of the housing may also be separate prior to assembly, i.e., not interconnected. In such an example embodiment of the present invention, it may be provided that the parts of the housing each have an identical shape, so that they may be manufactured, for example, using only one die mold. The two separate, connectible parts or half-shells may then be united or assembled to accommodate the choke coil.

The clip element may be made up of two clip parts or clip hooks, each of these clip hooks, e.g., being a component of a different part of the housing. As an alternative, the complete clip element may also be positioned on only one part of the housing.

Aspects attained by example embodiments of the present invention may be, in particular, that such a trap circuit arrangement may be cost-effectively manufactured and assembled, and that a thin-walled housing may also cause the trap circuit arrangement to be relatively light.

The housing may have at least one spring element, which interacts with at least one clip element of the housing to allow it to be mounted to an attachment surface in a prestressed manner. An example of an attachment surface is a panel of a motor vehicle. A play-free attachment may be attainable is this manner, so that even in the case of bumps or vibrations, no noises are caused by the housing striking against the panel.

In an example embodiment of the present invention, a trap circuit arrangement includes a first cable, a second cable, a choke coil including a first connection region and a second connection region, the first cable in electrical contact with the first connection region, the second cable in electrical contact with the second connection region, and a housing accommodating the choke coil formed of two assembled parts, the housing including at least one clip element arranged on an exterior of the housing configured to attach to an attachment surface.

The housing may include at least one spring element arranged on the exterior of the housing configured to mount the housing to the attachment surface in a prestressed manner.

The clip element may be an integral component of at least one part of the housing. The clip element and/or the spring element may be integral components of at least one part of the housing.

One end of the first cable may be in contact with the first connection region, and one end of the second cable may be in contact with the second connection region.

Windings of the choke coil are helix-shaped, and, in the connection regions of the choke coil, ends of the cables may be arranged to have a direction component that extends parallel to a longitudinal axis of the helix-shaped choke coil.

The trap circuit arrangement may include a flexurally soft strap connecting the two parts of the housing.

The connection regions of the choke coil may be arranged inside the housing.

Each of the two parts of the housing may include at least one recess, the recesses arranged to form a passage through a wall of the housing for at least one cable in an assembled state of the parts.

In an example embodiment of the present invention, a trap circuit arrangement includes a first cable, a second cable, a choke coil including helix-shaped windings, the choke coil including a first connection region and a second connection region, the first cable in electrical contact with the first connection region, the second cable in electrical contact with the second connection region, and a housing accommodating the choke coil including the connection regions, the housing formed of two assembled parts and including at least one clip element and at least one spring element arranged on an exterior of the housing, the at least one clip element and the at least one spring element configured to mount the housing to an attachment surface in a prestressed manner, at least one of the clip element and the spring element arranged as an integral component of at least one part of the housing.

In an example embodiment of the present invention, a trap circuit arrangement includes first cable means, second cable means, choke coil means including a first connection region and a second connection region, the first cable means in electrical contact with the first connection region, the second cable means in electrical contact with the second connection region, and housing means for accommodating the choke coil, the housing means formed of two assembled parts, the housing means including at least one clip means arranged on an exterior of the housing means for attaching to an attachment surface.

Further details and aspects of the trap circuit arrangement according to the present invention are derived from the following description of an exemplary embodiment, on the basis of the attached Figures.

DETAILED DESCRIPTION

In the represented exemplary embodiment, a trap circuit arrangement is described, as it is used in a circuit for heating a rear window of a motor vehicle. In this context, the rear window has wires, which are simultaneously used as an antenna for receiving radio signals in the FM and AM frequency-band ranges.

Figure 1:
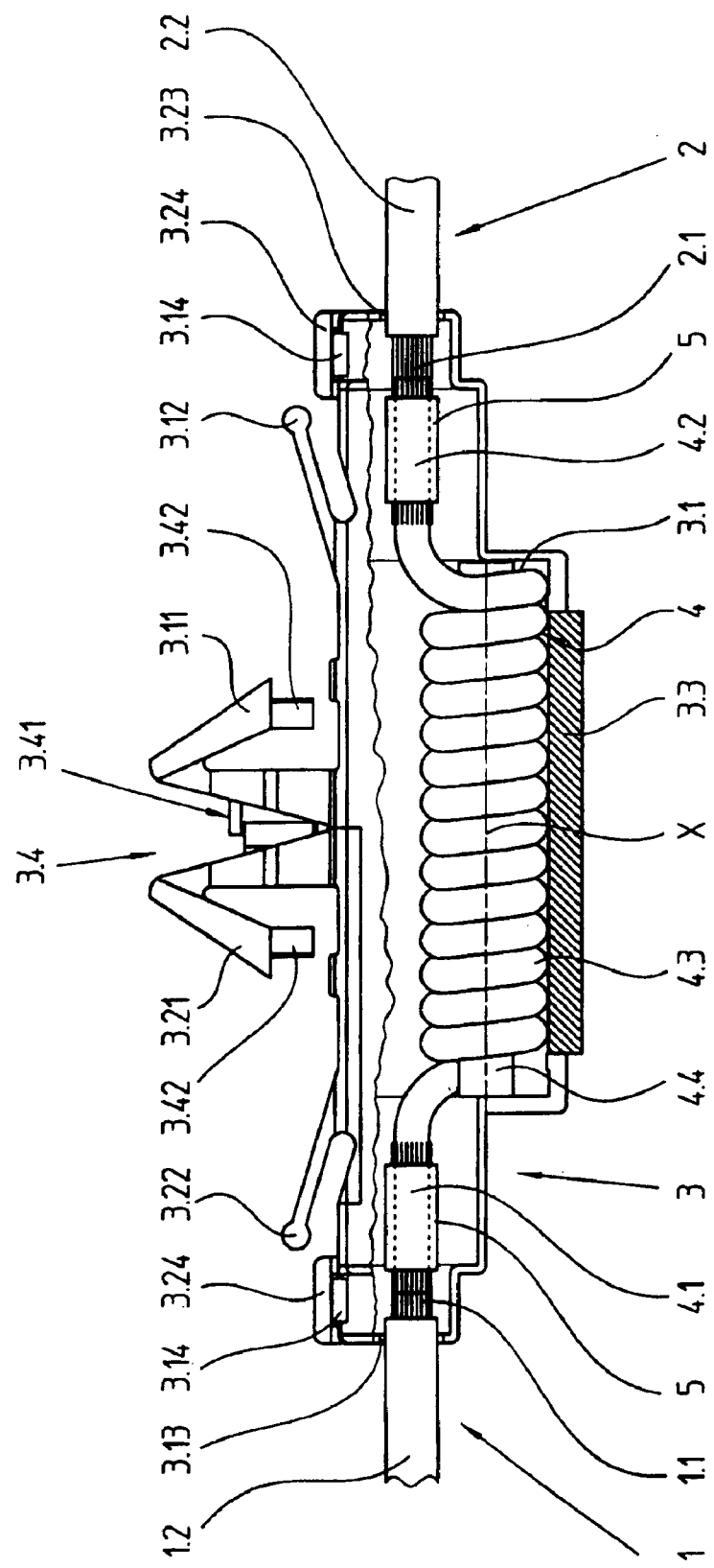
FIG. 1 is a side view of an example embodiment of a trap circuit arrangement according to the present invention.
Figure 2:
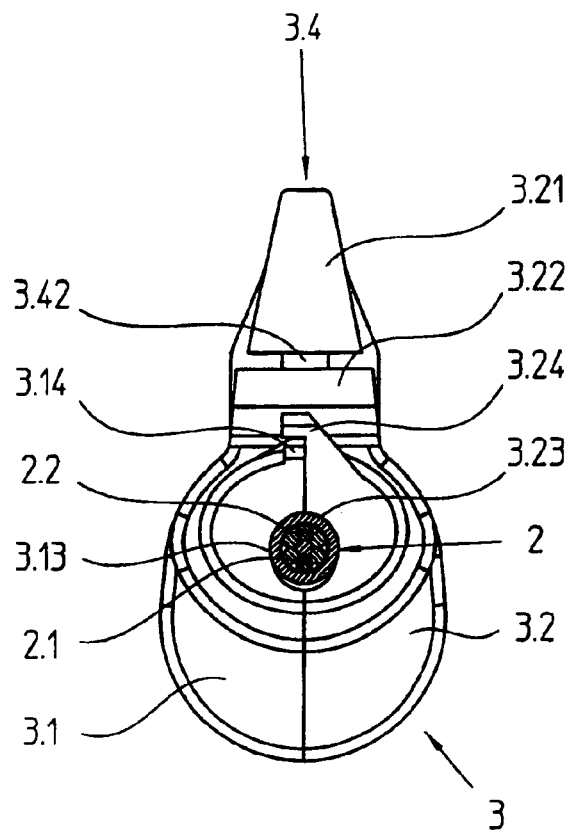
FIG. 2 is a front view of the trap circuit arrangement.
Figure 3:
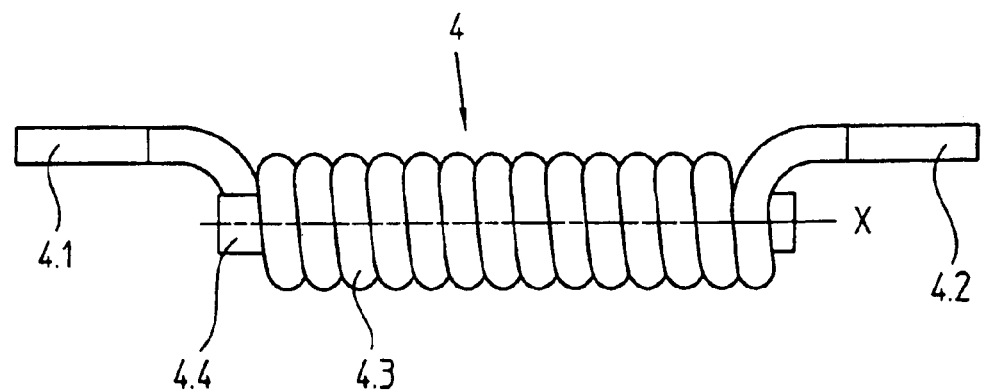
FIG. 3 illustrates a choke coil.
Figure 5:
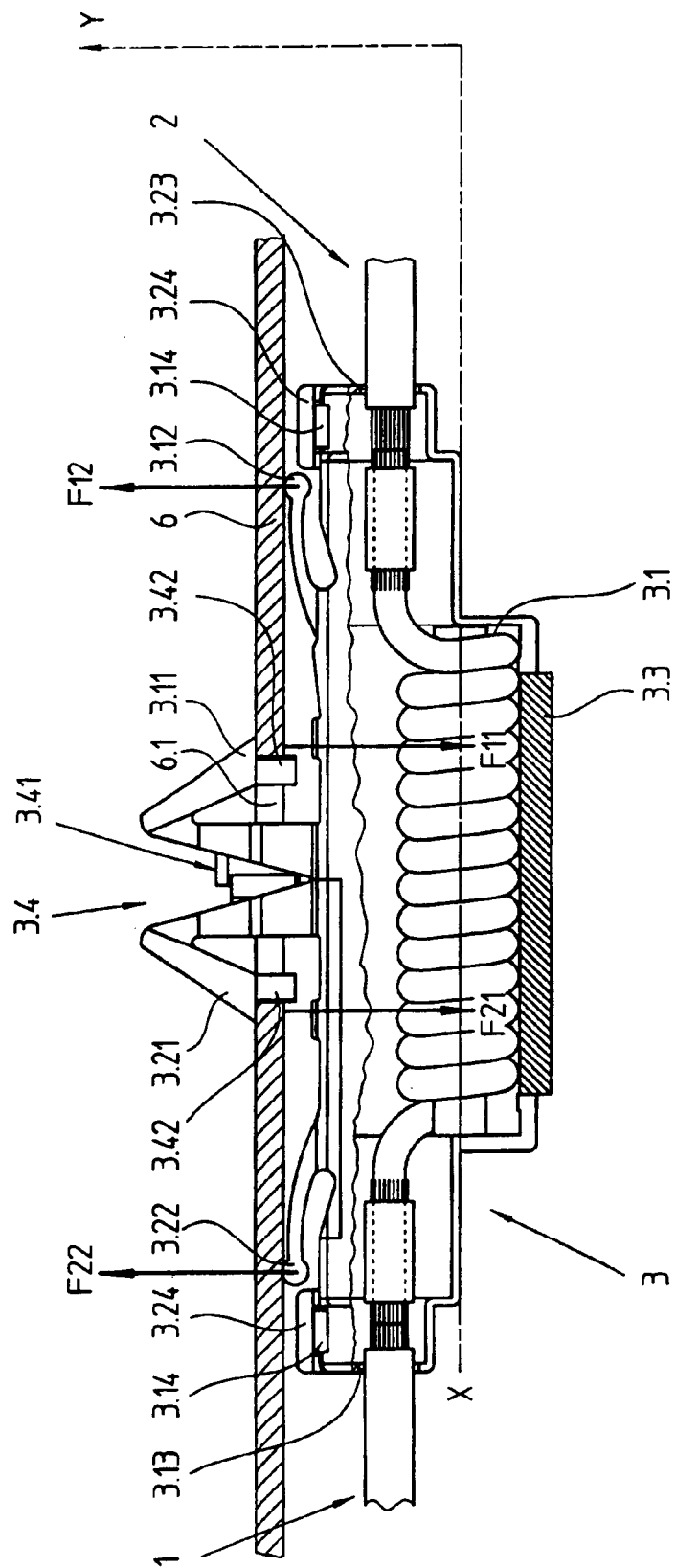
FIG. 5 illustrates the trap circuit arrangement installed on an attachment surface.

Shown in FIG. 1 is a side view having a partial sectional view of a trap circuit arrangement according to an example embodiment of the present invention. The trap circuit arrangement includes two cables 1, 2, which have several copper strands 1.1, 2.1 as conductors, the copper strands being surrounded by a plastic sheath 1.2, 2.2 for providing electrical insulation (see also FIG. 2). Also belonging to the trap circuit arrangement is a housing 3, which encloses a choke coil 4 and is described in detail further below. Choke coil 4 is made up of a copper wire, which is provided with insulating varnish and is bent about central axis X along a cylindrical helix in a large region of choke coil 4, as shown in FIGS. 1, 3, and 5, so that windings 4.3 of choke coil 4 are helix-shaped, i.e., the winding region has a helical shape. Windings 4.3 surround a cylindrical iron core 4.4 and are bonded to it to provide mechanical fastening. Furthermore, choke coil 4 includes, according to FIG. 3, two connection regions 4.1, 4.2, in which the copper wire is free of insulating varnish, so that an electrical contact to cables 1, 2 may be produced there.

According to FIG. 1, the ends of the two cables 1, 2 are stripped of insulation, so that, in this region, copper strands 1.1, 2.1 are therefore exposed and not surrounded by plastic sheath 1.2, 2.2. With the aid of a splice band 5, the stripped end of first cable 1 is contacted with first connection region 4.1 of choke coil 4, using a crimped connection. In an analogous manner, the stripped end of second cable 2 is electroconductively attached to second connection region 4.2 of choke coil 4. Therefore, the crimped connections produce both an electrical contact and a mechanical connection between choke coil 4 and the two cables 1, 2. In connection regions 4.1, 4.2 of choke coil 4, the ends of cables 1, 2 are, in this context, oriented parallelly to longitudinal axis X of helix-shaped choke coil 4.

Figure 4:
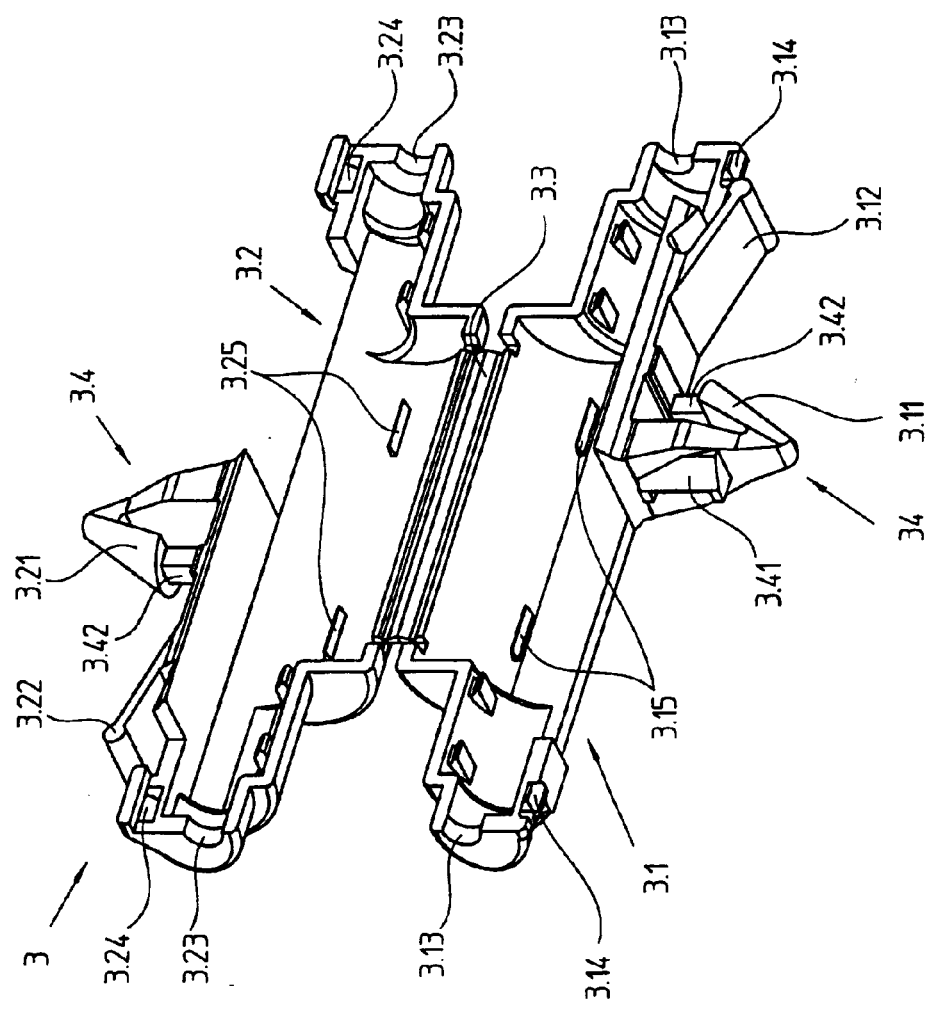
FIG. 4 is a perspective view of a housing for accommodating the choke coil.

A perspective view of housing 3 in the opened state is represented in FIG. 4. In the shown exemplary embodiment, housing 3 is made out of electrically nonconductive material, e.g., polyamide. Housing 3 is made up of two parts, which take the form of half-shells 3.1, 3.2, which, for their part, are interconnected by a flexurally soft strap 3.3. Over its entire length, strap 3.3 has two narrow, thin-walled regions parallel to the bending axis. In this manner, strap 3.3 acts as a hinge or solid joint, so that the two half-shells 3.1, 3.2 of housing 3 may be swiveled or folded about this strap 3.3. Although housing 3 is made up of a plurality of parts (in the shown exemplary embodiment, these are the two half-shells 3.1, 3.2), the technical solution having strap 3.3 as a swivel element still causes the housing to be, e.g., in one piece. This may provide that, inter alia, that, during the assembly or manufacturing of the trap circuit arrangement, connectible housing 3 only has to be handled as a single part.

According to the represented exemplary embodiment, each half-shell 3.1, 3.2 has a spring arm 3.12, 3.22, respectively, and a clip hook 3.11, 3.21, respectively. Clip hooks 3.11, 3.21 and spring arms 3.12, 3.22 are produced directly with half-shells 3.1, 3.2 in the injection molding process and are therefore, in each instance, an integral part of each half-shell 3.1, 3.2 of housing 3. Each clip hook 3.11, 3.21 includes, on its part, projections in the form of a snap fastener 3.41 and so-called plug 3.42.

In addition, snap-on hooks 3.14 are provided on first half-shell 3.1, and snap openings 3.24 are provided on second half-shell 3.2. In addition, two recesses 3.13, 3.23 are provided on each half shell 3.1, 3.2, respectively, and two clamping bars 3.15, 3.25 are provided on the inside of half-shells 3.1, 3.2, respectively. The wall thickness of half-shells 3.1, 3.2 is basically the same all over, whereby, inter alia, a light design may be achieved, which may be advantageous in mobile applications, such as, for instance, in motor vehicles. In addition, this is may provide an exceedingly material-saving and cost-effective design.

If choke coil 4 is inserted with previously contacted cables 1, 2 into one of half-shells 3.1, 3.2 and the two half-shells 3.1, 3.2 are folded up, then a crossbar of snap openings 3.24 is grasped from the back by snap-on hooks 3.14, so that a tangentially directed closing force (orthogonal to the X and Y directions) is generated. This force is supported by additional snap fastener 3.41 between clip hooks 3.11, 3.21.

On the outside of folded-up housing 3, the folding-up therefore produces a clip element 3.4 that is formed by the two clip hooks 3.11, 3.21.

In the folded-up state of housing 3, two spring arms 3.12, 3.22 used as a spring element are also correspondingly situated on the outside of housing 3.

Assembled half-shells 3.1, 3.2 form a housing 3, which essentially includes five hollow cylindrical chambers. The central and largest chamber is used to accommodate windings 4.3 of choke coil 4. Housing 3 is dimensioned in such a manner that, when housing 3 is closed, clamping bars 3.15, 3.25 press against windings 4.3 from both sides, so that choke coil 4 is contained in housing 3 in a secure and play-free manner. This may prevent noise from being produced in response to bumps or vibrations, as may occur frequently in the case of motor vehicles.

According to FIG. 1, the two chambers adjacent to the central chamber accommodate connection regions 4.1, 4.2 of choke coil 4, as well as the ends of cables 1, 2. The ends of the cables are connected to the connection regions and have splice bands 5. The two outermost chambers surround cables 1, 2. In addition, the walls of the two outermost chambers each have recesses 3.13 and 3.23. After half-shells 3.1, 3.2 are united, these recesses 3.13, 3.23 on different half-shells 3.1, 3.2 each form a passage for cables 1, 2 through the housing wall. In the exemplary embodiment illustrated, the trap circuit arrangement is designed so that the stripped region of cables 1, 2 is completely inside housing 3, which means that effective encapsulation or insulation is attained and short-circuits may be prevented. The designing of housing 3 to have five offset chambers allows housing 3 to be effectively adapted to the outer contour of choke coil 4, together with cables 1, 2. This also allows a material-saving and cost-effective design to be achieved. In addition, the different inner diameters of the respective chambers allow choke coil 4 to be axially secured in a very low-cost manner. Therefore, a separate element no longer has to be provided for fixing choke coil 4 and cables 1, 2 in position in the X direction with respect to housing 3.

If the trap circuit arrangement is appropriately manufactured, then, depending on the design, the trap circuit may be simply mounted, e.g., in a motor vehicle, to a panel or a plastic part as an attachment surface 6. For this purpose, an oblong hole 6.1 is prepared in attachment surface 6, as is illustrated in FIG. 5. Clip element 3.4 is inserted into this oblong hole 6.1, housing 3 being oriented in such a manner that the longer axis of oblong hole 6.1 extends in the X direction. In this context, clip hooks 3.11, 3.21 are elastically compressed or deformed in the X direction. Plugs 3.42 lock into oblong hole 6.1, and, at the same time, spring arms 3.12, 3.22 are elastically bent. Reaction forces F11, F21 counteract forces F12, F22 of spring arms 3.12, 3.22 in the Y direction as a result of the two clip hooks 3.11, 3.21 gripping from behind: In this manner, the trap circuit arrangement is fastened to attachment surface 6 in a prestressed manner with respect to the Y direction.

Therefore, the trap circuit may be mounted to attachment surface 6 in an exceedingly short time without using a tool, housing 3 automatically orienting itself so that its axis is parallel to the longitudinal direction of oblong hole 6.1.

The length of plugs 3.42 is dimensioned to be greater than the thickness of the panel used as attachment surface 6, so that plugs 3.42 project above the corresponding surface of the panel after the trap circuit is mounted. This projection may be used as a working surface for a pair of pliers, by which clip hooks 3.11, 3.21 may be squeezed again in the course of detaching the trap circuit from attachment surface 6.

What is claimed is:

1. A trap circuit arrangement, comprising:
   a first cable;
   a second cable;
   a choke coil including a first connection region and a second connection region, the first cable in electrical contact with the first connection region, the second cable in electrical contact with the second connection region; and
   a housing accommodating the choke coil formed of two assembled parts, the housing including at least one clip element arranged on an exterior of the housing configured to attach to an attachment surface, the clip element formed by two clip parts, each clip part arranged on a respective one of the two assembled parts of the housing.

2. The trap circuit arrangement according to claim 1, wherein the housing includes at least one spring element arranged on the exterior of the housing configured to mount the housing to the attachment surface in a prestressed manner.

3. The trap circuit arrangement according to claim 2, wherein at least one of the clip element and the spring element is an integral component of at least one part of the housing.

4. The trap circuit arrangement according to claim 2, wherein the clip element and the spring element are integral components of one part of the housing.

5. The trap circuit arrangement according to claim 1, wherein one end of the first cable is in contact with the first connection region, and one end of the second cable is in contact with the second connection region.

6. The trap circuit arrangement according to claim 1, wherein windings of the choke coil are helix-shaped.

7. The trap circuit arrangement according to claim 6, wherein, in the connection regions of the choke coil, ends of the cables are arranged to have a direction component that extends parallel to a longitudinal axis of the helix-shaped choke coil.

8. The trap circuit arrangement according to claim 1, further comprising a flexurally soft strap connecting the two parts of the housing.

9. The trap circuit arrangement according to claim 1, wherein the connection regions of the choke coil are arranged inside the housing.

10. The trap circuit arrangement according to claim 9, wherein each of the two parts of the housing includes at least one recess, the recesses arranged to form a passage through a wall of the housing for at least one cable in an assembled state of the parts.

11. A trap circuit arrangement, comprising:
    a first cable;
    a second cable;
    a choke coil including helix-shaped windings, the choke coil including a first connection region and a second connection region, the first cable in electrical contact with the first connection region, the second cable in electrical contact with the second connection region; and
    a housing accommodating the choke coil including the connection regions, the housing formed of two assembled parts and including at least one clip element and at least one spring element arranged on an exterior of the housing, the at least one clip element and the at least one spring element configured to mount the housing to an attachment surface in a prestressed manner, at least one of the clip element and the spring element arranged as an integral component of at least one part of the housing, the clip element formed by two clip parts, each clip part arranged on a respective one of the two assembled parts of the housing.

12. A trap circuit arrangement, comprising:

first cable means;

second cable means;

choke coil means including a first connection region and a second connection region, the first cable means in electrical contact with the first connection region, the second cable means in electrical contact with the second connection region; and housing means for accommodating the choke coil, the housing means formed of two assembled parts, the housing means including at least one clip means arranged on an exterior of the housing means for attaching to an attachment surface, the clip means formed by two clip parts, each clip part arranged on a respective one of the two assembled parts of the housing means.

* * * * *